(12) United States Patent
Chang et al.

(10) Patent No.: US 9,224,615 B2
(45) Date of Patent: Dec. 29, 2015

(54) NOBLE GAS BOMBARDMENT TO REDUCE SCALLOPS IN BOSCH ETCHING

(71) Applicant: Taiwan Semiconductor Manufacturing Co., Ltd., Hsin-Chu (TW)

(72) Inventors: Che-Ming Chang, Longtan Township (TW); Lee-Chuan Tseng, New Taipei (TW); Shih-Wei Lin, Taipei (TW); Chih-Jen Chan, Changhua (TW); Yuan-Chih Hsieh, Hsinchu (TW); Ming Chyi Liu, Hsinchu (TW); Chung-Yen Chou, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/023,563

(22) Filed: Sep. 11, 2013

(65) Prior Publication Data

US 2015/0069581 A1    Mar. 12, 2015

(51) Int. Cl.
*H01L 21/265* (2006.01)
*H01L 21/3065* (2006.01)
*H01L 27/00* (2006.01)
*H01L 21/263* (2006.01)

(52) U.S. Cl.
CPC ...... *H01L 21/30655* (2013.01); *H01L 21/2633* (2013.01); *H01L 21/3065* (2013.01); *H01L 27/00* (2013.01)

(58) Field of Classification Search
CPC .............. H01L 21/768; H01L 21/2658; H01L 21/30655
USPC .................................. 257/622; 438/703, 710
See application file for complete search history.

(56) References Cited

U.S. PATENT DOCUMENTS

| | | | |
|---|---|---|---|
| 5,423,940 A * | 6/1995 | Chen et al. | 216/66 |
| 6,846,746 B2 | 1/2005 | Rattner et al. | |
| 6,924,235 B2 | 8/2005 | Johnson et al. | |
| 8,652,969 B2 * | 2/2014 | Fuller et al. | 438/703 |
| 2003/0211752 A1 | 11/2003 | Rattner et al. | |
| 2004/0232106 A1 * | 11/2004 | Oka et al. | 216/26 |
| 2007/0281474 A1 * | 12/2007 | Suzuki et al. | 438/677 |
| 2014/0057446 A1 * | 2/2014 | Yu et al. | 438/710 |

OTHER PUBLICATIONS

Prime Faraday Partnership. "An Introduction to MEMS (Micro-Electricalmechanical Systems)." ISBN: 1-84402-020-7. Published in Jan. 2002. 56 Pages.

Oxford Instruments Plasma Technology. "The Bosch Process for Etching Micro-Mechanical Systems (MEMS)—Principles, Advances and Applications." Published on Nov. 26, 2010. 11 Pages.

* cited by examiner

*Primary Examiner* — Matthew W Such
*Assistant Examiner* — Warren H Kilpatrick
(74) *Attorney, Agent, or Firm* — Eschweiler & Associates, LLC

(57) ABSTRACT

A method of etching a trench in a substrate is provided. The method repeatedly alternates between using a fluorine-based plasma to etch a trench, which has trench sidewalls, into a selected region of the substrate; and using a fluorocarbon plasma to deposit a liner on the trench sidewalls. The liner, when formed and subsequently etched, has an exposed sidewall surface that includes scalloped recesses. The trench, which includes the scalloped recesses, is then bombarded with a molecular beam where the molecules are directed on an axis parallel to the trench sidewalls to reduce the scalloped recesses.

20 Claims, 4 Drawing Sheets

US 9,224,615 B2

NOBLE GAS BOMBARDMENT TO REDUCE SCALLOPS IN BOSCH ETCHING

BACKGROUND

The rapidly expanding microelectrical mechanical systems (MEMS) market and other areas of semiconductor processing can utilize etching techniques to achieve deep trenches in silicon substrates. For example, some microfluidic devices, chemical, biological and optical transducers can benefit from having deep, high aspect ratio trenches with extremely smooth sidewalls. Dynamic random access memory (DRAM) and/or complementary metal oxide semiconductor (CMOS) devices, among others, are also applications where deep trench etching can be advantageous.

The Bosch process is one process traditionally used for deep silicon etching, and is carried out by using alternating deposition and etching cycles. Although useful in many applications, traditional Bosch processes result in the formation of "scallops" on sidewalls of etched structures. These "scallops", which are one type of sidewall roughness, are a direct consequence of the alternating deposition and etching cycles. These scallops detract from the use of Bosch processing in applications where high aspect ratio trenches with extremely smooth sidewalls are desired.

One conventional approach to address the scallops is to include additional gases, such as oxygen or nitrogen, or to use shorter cycles during the Bosch process to encourage more anisotropic etching behavior. Although this can reduce scallops somewhat, the use of additional gases can make etching difficult to control and can reduce etching rates (e.g., decrease overall process throughput). In particular, an initial gas surge or flow burst in each cycle can affect process reproducibility and stability. Efforts to reduce the initial gas surge by maintaining a minimal flow rate during the "off" cycle can cause process flow gas overlap and may result in long cycles (e.g., low process throughput). Therefore, conventional techniques for limiting sidewall scallops in the Bosch process are less than ideal.

DETAILED DESCRIPTION

Figure 1:
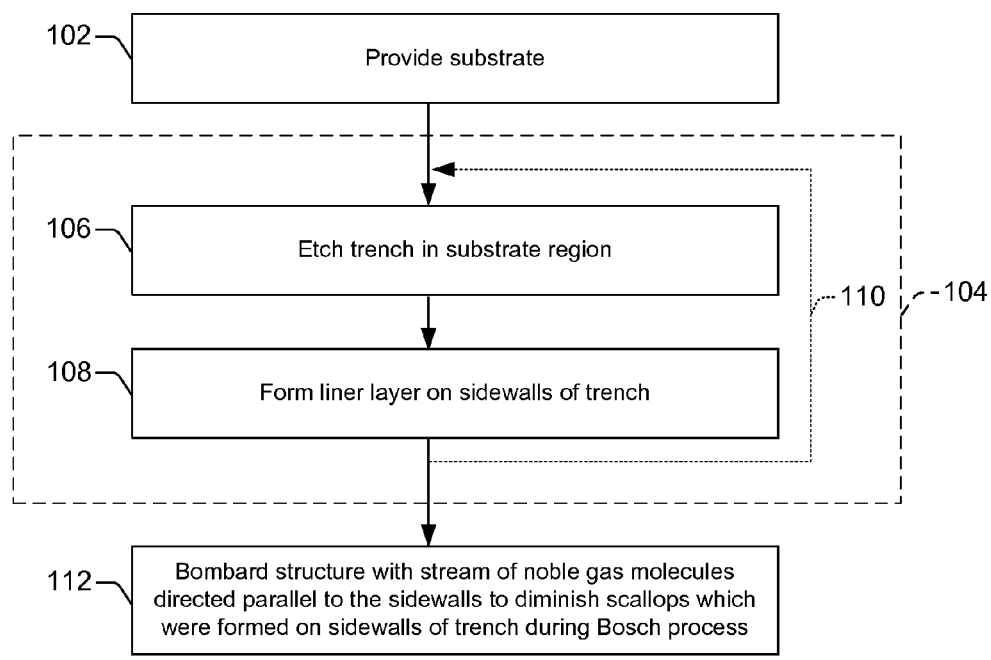
FIG. 1 shows a methodology in flowchart format of a method of forming a deep, high aspect ratio trench in accordance with some embodiments.

One or more implementations of the present invention will now be described with reference to the attached drawings, wherein like reference numerals are used to refer to like elements throughout. The drawings are not drawn to scale. Although the term "trench" is traditionally used to define a long, narrow ditch, the term "trench" as used in this disclosure is not limited to a long, narrow, ditch, but is to be construed broadly to include rectangular holes that are not so long and narrow, square holes, circular or rounded holes, or even holes with meandering or polygonal geometries, any and all of which are contemplated as being a "trench" for purposes of this disclosure.

To provide deep, high aspect ratio trenches with extremely smooth sidewalls, the present disclosure sets forth processing techniques where a molecular beam is used after etching and deposition cycles to smooth a rough surface of trench sidewalls. For example, after a Bosch process of alternating etching and deposition cycles is used to form a deep trench, albeit with scallops on sidewalls thereof, the trench and scallops are bombarded with a molecular beam directed in a direction parallel to the trench sidewalls to reduce the height of the scallops.

To set forth some embodiments, FIG. 1 illustrates a somewhat general manufacturing method in flowchart format while FIGS. 2-9 collectively illustrate a more detailed manufacturing method as a series of cross-sectional views. It will be appreciated that although these methods each illustrate a number of acts, not all of these acts are necessarily required, and other un-illustrated acts may also be present. Also, the ordering of the acts in some embodiments can vary from what is illustrated in these figures. In addition, the illustrated acts can be further divided into sub-acts in some implementations, while in other implementations some of the illustrated acts can be carried out concurrently with one another.

FIG. 1's method 100 starts at 102 when a substrate is provided. In 104, a Bosch process is carried out to form a deep, high aspect ratio trench in a selected region of the substrate. The Bosch process 104 is carried out by using alternating deposition and etching cycles. Thus, in 106, an etch process is carried out to form a trench in the selected substrate region. In 108, after the etch process has formed a trench, a liner layer is formed on sidewalls of the trench. The etch process and formation of the liner are carried out in successive cycles (i.e., repeated as shown by 110) until a desired trench depth is reached. Unfortunately, the Bosch process 104 can cause undesirable roughness, such as scallops, to form on the sidewalls of the trench.

The presently disclosed techniques follow the Bosch process 104 with a post-Bosch molecular beam treatment 112 to "smooth" the trench sidewalls. This treatment allows a Bosch process 104 to be carried out with a relatively high etch rate, which even though leaving scallops on the sidewalls of the trench, provides a high throughput. After the trench has been formed with scallops on the trench sidewalls using the Bosch process 104, the structure is bombarded with molecular beam in 112 to reduce the height of the scallops. Somewhat akin to a sandblaster, the molecular beam gradually diminishes the height of the scalloped surface until the trench sidewalls have become relatively smooth. By promoting a good overall throughput, this procedure provides a high-throughput Bosch process with relatively smooth sidewalls, which may be useful in many applications, such as in MEMS devices, CMOS devices, and DRAM, among others.

To promote even greater through (e.g., to accelerated sidewall smoothing), in some instances a small amount of fluorine (e.g., $\frac{1}{6}$ to $\frac{1}{10}$ by volume) can be present while the molecular beam is smoothing out the scallops in 112. Hence, compared to conventional approaches where throughput was low and/or undesirable scallops were present, these techniques can provide a high throughput with relatively smooth sidewalls.

Turning now to FIGS. 2-9, one can see a series of cross-sectional views that collectively depict a method of forming a deep, high aspect ratio trench in accordance with some embodiments.

Figure 2:
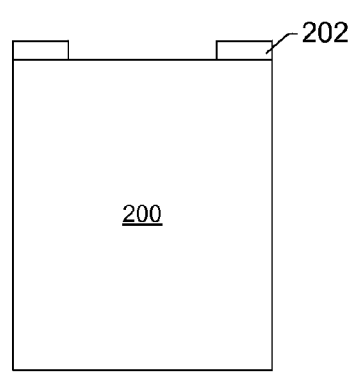
FIGS. 2-9 show a series of cross-sectional diagrams that collectively illustrate a method of forming a deep, high aspect ratio trench in accordance with some embodiments.

FIG. 2 illustrates a substrate 200. It will be appreciated that "substrate" as referred to herein may comprise any type of substrate, and typically is a semiconductor substrate such as a bulk silicon wafer, a binary compound substrate (e.g., GaAs wafer), a ternary compound substrate (e.g., AlGaAs), or higher order compound wafers, with or without additional insulating or conducting layers formed thereover, among others. When semiconductor substrates are used, they can also include non-semiconductor materials such as oxide in silicon-on-insulator (SOI), partial SOI substrate, polysilicon, insulator, oxide, metal, amorphous silicon, or organic material, among others. In some embodiments, the substrate can also include multiple wafers or dies which are stacked or otherwise adhered together. The substrate can include wafers which are cut from a silicon ingot, and/or any other type of semiconductor/non-semiconductor and/or deposited or grown (e.g. epitaxial) layers formed on an underlying substrate.

As can be seen in FIG. 2, a hard mask layer 202 has been formed and patterned over the substrate 200. For example, the patterned hard mask layer 202 can be a patterned photoresist layer, a patterned nitride layer, a patterned oxide layer, or another type of hard mask that is relatively impervious to etching during the subsequent Bosch process to be carried out.

FIGS. 3-7, which are described in more detail below, show a series of etch operations (FIG. 3, FIG. 5) and deposition operations (FIG. 4, FIG. 6) in the Bosch process. Collectively the Bosch process of FIGS. 3-7 results in a relatively deep, high aspect ratio trench in the substrate (see trench 700, FIG. 7). However, to keep the overall etch time relatively fast, the Bosch process also results in scallops being formed on the trench sidewalls.

Figure 3:
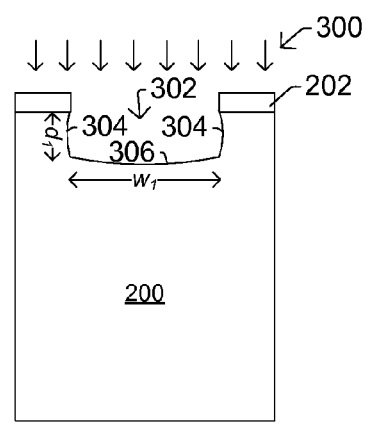

More particularly, the Bosch process starts in FIG. 3 when a fluorine-based plasma 300, such as a plasma based on $SF_6$ for example, is used to etch a first recess 302 into the substrate 200. As illustrated in FIG. 3, in forming the first recess 302, the fluorine-based plasma 300 carves out rounded sidewalls 304 that are scalloped in shape as well as a rounded bottom surface 306. In some embodiments, a depth, $d_1$, of the first recess 302 can range from approximately 0.01 um to approximately 1 um, and a width, $w_1$, of the first recess can range from approximately 0.1 um to approximately 1000 um. In some embodiments, SF6 gas can be used for this etch, using a gas flow rate of between 10~1000 sccm, a plasma power of 100 watts to approximately 5000 watts, a process pressure of between approximately 5 mTorr and 500 mTorr, for an etch time of 0.1 sec to 10 sec.

Figure 4:
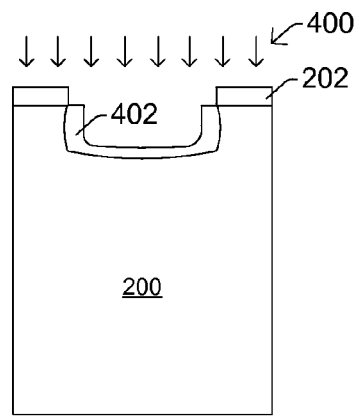

The Bosch process continues in FIG. 4 when a fluorocarbon-based plasma 400, such as a plasma based on octo-fluorocyclobutane (c-$C_4F_8$) for example, is used to form a passivation liner 402 on sidewalls of the first recess 302. In some embodiments, the passivation liner 402 can be formed only on the trench sidewalls, and not on bottom trench surface, while in other embodiments, the passivation liner can be formed on the sidewalls and bottom trench surface and then removed from the bottom trench surface prior to the next etching step. The passivation liner 402 can be composed of C, F, Si, and/or O, and can have a thickness ranging from approximately 10 angstroms to approximately 300 angstroms. In some embodiments, $C_4F_8$ gas can be used to form the liner, using a gas flow rate of between 10~1000 sccm, a plasma power of 100 watts to approximately 5000 watts, a process pressure of between approximately 5 mTorr and 500 mTorr, for an deposition time of 0.1 sec to 10 sec.

Figure 5:
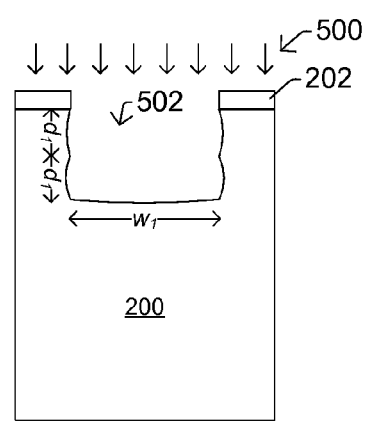

In FIG. 5, fluorine-based plasma 500 is used to etch a second recess 502 into the substrate 200. Like the first recess 302, the second recess 502 has rounded sidewalls that are scalloped in shape as well as a rounded bottom surface. Typically the fluorine based plasma 500 used to form the second recess 502 is the same as the fluorine-based plasma 300 used to form the first recess 302. This helps to ensure the width of the first and second recesses are approximately the same and promotes "vertical" trench sidewalls or nearly vertical trench sidewalls. However, if the resultant trench is to be v-shaped, undulating, or have some other sidewall surface geometry, the plasma conditions for 300, 500 can also be different.

Figure 6:
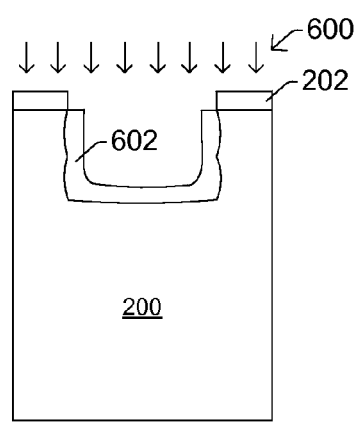

In FIG. 6 a fluorocarbon-based plasma 600, such as a plasma based on octo-fluorocyclobutane (c-$C_4F_8$) for example, is used to form a passivation liner 602 on sidewalls of the second recess 502. Typically the fluorocarbon-based plasma 600 is the same as fluorocarbon-based plasma 400.

Figure 7:
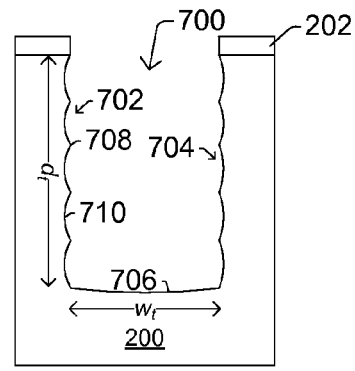

In FIG. 7, subsequent recesses have been etched, for example by using a fluorine-based plasma, and corresponding passivation layers (not shown) have been formed on the sidewalls of the subsequent recesses, for example by using a fluorocarbon-based plasma. Etching and deposition steps are repeatedly cycled until the trench 700 reaches the desired total depth, $d_t$. As shown, the passivation liner can be removed to expose the trench sidewalls 702, 704 and trench bottom surface 706. On each trench sidewall, scallops are present. The scallops can have amplitudes, as measured between scallop crests 708 and scallop troughs 710. In some embodiments, the scallop amplitude can range from approximately 4000 angstroms to approximately 1000 angstroms. As mentioned, these scallops and/or other forms of roughness on the sidewalls of the trench 700 can detract from an overall smoothness which is desired for many device applications.

The conditions for the etching and deposition cycles used in FIGS. 3-7 can vary widely depending on the desired etch rate, aspect ratio, and sidewall smoothness desired. The endpoint for the Bosch process can occur when the number of cycles reaches a predetermined number at which the desired trench depth, $d_t$, is expected to be reached, or can occur by performing real-time monitoring of the trench depth and stopping the process when measurement indicates the desired trench depth is reached.

Figure 8:
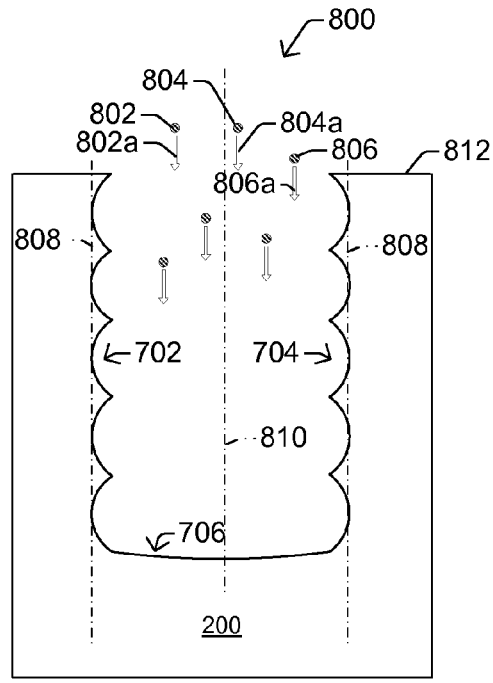

To promote greater sidewall smoothness, FIG. 8 illustrates a process by which the trench 700 of FIG. 7, albeit after the hard mask 202 has been removed, is bombarded with a molecular beam 800 to reduce the amplitude of the scallops. The term "molecular beam" as used herein can include a beam of particles (e.g., 802, 804, 806, . . . ) which move at approximately equal velocities (e.g., 802a, 804a, 806a, . . . ) so there are very few collisions between the particles. In some embodiments, the molecular beam 800 is made up of inert gas molecules, such as argon or xenon molecules for example, wherein argon is typically preferred due to its lower cost. However, the molecular beam 800 is not limited to implementations where the particles are atoms, as the particles can also be free radicals, charge neutral molecules, or ions. In other embodiments, rather than a molecular beam being used, another type of beam, such as a photon beam in the form of a laser can be used.

As shown, notwithstanding the scallops, the trench sidewalls 702 704 extend in direction 808, which is substantially in parallel with an axis 810 along with the molecular beam 800 is directed. For example, in the illustrated example, the trench sidewalls 702, 704 are substantially parallel with one another (and substantially parallel with axis 810) and are perpendicular to an upper substrate surface 812. In this way, when the particles of molecular beam 800 collide with the lattice of the scallops, the particles tend to eject material from the scallops to gradually "smooth out" the scallops.

In some embodiments, small amounts of fluorine can be present while the molecular beam treatment is being carried out. This fluorine can help to expedite the "smoothing" of the sidewalls, relative to embodiments where fluorine is not present during the molecular beam treatment. In some embodiments, the fluorine gas can consume approximately ⅙ to approximately ⅒ of the gaseous mixture present, by volume, in the processing chamber while the ion bombardment is being carried out.

Figure 9:
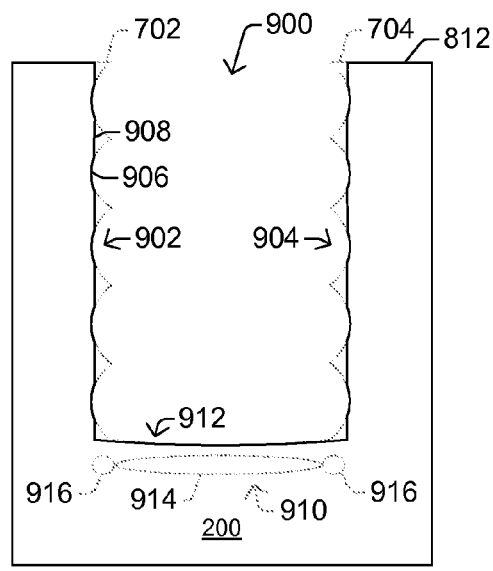

As shown in FIG. 9, after the molecular beam process is complete, the result is a deep, high-aspect ratio trench 900 with substantially smooth trench sidewalls 902, 904. The sidewalls of the trench have smoothed scalloped surfaces that have troughs 906 and plateaus 908, wherein an amplitude or height between a trough 906 and a plateau 908 is less than 500 angstroms. Due to the previous use of the inert gas molecular beam 800, the trench 900 can exhibit an inert gas doped region 910 proximate to the bottom trench surface 912 and disposed within the semiconductor body. The inert gas doped region 910 has a first dopant profile 914, which is approximately constant near a central region of the bottom trench surface due to the fact that this area was continuously exposed to the molecular beam 800. Near an edge of the bottom trench surface adjacent to the sidewall trench surface, a second dopant profile 916 is found. This second dopant profile has a second dopant concentration which is lower than the first dopant concentration due to the fact that scallops tend to "shield" this region from the molecular beam 800. Moreover, the doping concentration of the second dopant profile 916 may grow smaller as the sidewall is approached, due to the scallops being thicker (more shielding) near the sidewall.

As viewed from above, the trench 900 can have one of several different configurations. In some embodiments the trench can be rectangular and can have a width of approximately 2 μm to approximately 5 μm, and a depth of approximately 30 μm. In other embodiments, the trenches can be substantially circular and can have a radius of approximately 50 μm and a depth of approximately 150 μm. The trenches can have a nearly vertical sidewall angle, which is measured relative to an upper substrate surface 812, where nearly vertical means that the sidewalls meet the upper substrate surface at an angle of 90-degrees, plus or minus 1 degree. In some embodiments, the trench 900 can have a depth:width aspect ratio ranging from of approximately 3:1 to approximately 15:1, for example.

Although FIGS. 3-9 show an example where a single bombardment step is performed after all Bosch etch and deposition steps are complete, it is also possible for bombardment to be carried out at the end of each Bosch etch and deposition cycle (or periodically or intermittently between Bosch etch and deposition cycles). However, using multiple bombardments during Bosch processing may make use of additional mask steps, and thus the illustrated single bombardment process may be favored in some regards.

Figure 10:
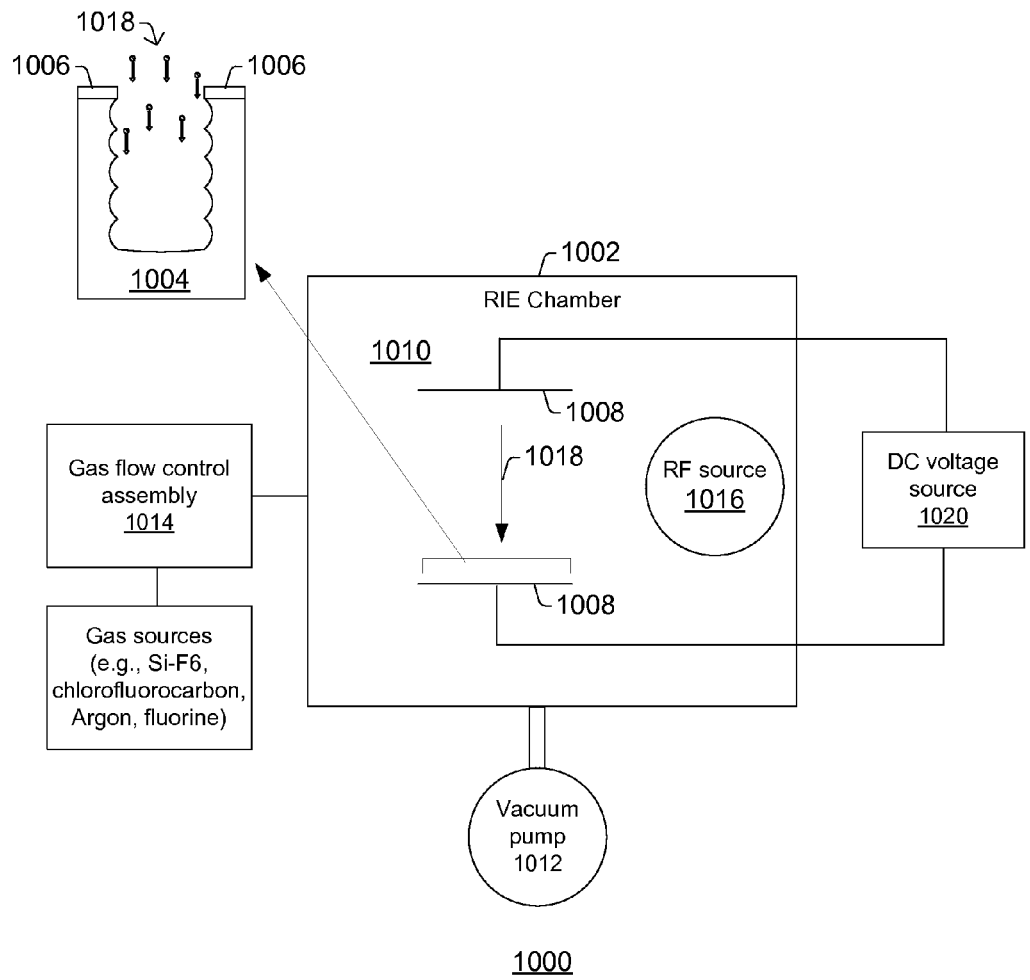
FIG. 10 shows system in accordance with some embodiments.

FIG. 10 shows a system 1000 in accordance with some embodiments. The system includes a processing chamber 1002 that can be opened to insert one or more substrates 1004 having a mask 1006 thereon so regions where deep trenches are desired are exposed through the mask. When inserted, the substrate(s) 1004 are placed on between upper and lower electrodes 1008, such as on a wafer chuck, and the processing chamber 1002 is closed. At this point, the region 1010 inside the processing chamber 1002 is environmentally isolated from the ambient environment outside the chamber.

A vacuum pump 1012 is then enabled to pump the volume within the chamber down to vacuum (e.g., less than 1000 mTorr). At this point, a Bosch process is carried out to etch trenches, which can have rough or scalloped sidewalls, into the substrate 1004. To etch the trench, gas flow control assembly 1014 provides $SF_6$ gas into the chamber 1010, and the RF source 1016 is activated to form a plasma to etch a recess into the substrate 1004. Next, the RF source 1016 is turned off and the vacuum pump 1012 again pumps the chamber 1010 down to vacuum, after which the gas flow control assembly 1114 provides a fluoro-carbon gas into the chamber 1010. With the fluorocarbon gas present in the chamber, the RF source 1016 is again powered on to generate a fluoro-carbon plasma that deposits a passivation liner onto sidewalls of the recess in substrate 1004. Successive etches and depositions can be carried out to form trenches in the substrate 1004.

After the trenches are formed, the mask 1004 can be stripped off the substrate 1004, and a molecular beam 1018 can be directed toward the substrate 1004. If a molecular beam is used in the form of an ion beam, the ion beam can be formed by applying a high voltage or high current to a beam source to ionize molecules of the beam source, and then apply a high voltage by DC voltage source 1020 to accelerate the ionized molecules up to a desired speed. For example, the RF source can use a power of between 1200 Watts and 1700 watts for bombardment in one such example. Filtering and/or focusing elements, such as in the form of magnetic or electric beam forming elements, can be used to filter and/or focus such an ion beam. A charge-neutral ion beam, in contrast, can alternatively be produced by allowing a gas at higher pressure to expand through a small orifice into the chamber 1010, which is at lower pressure, to form a beam of particles.

Thus, it will be appreciated that some embodiments relate to a method. In this method, a trench is formed in a semiconductor body. The trench has a sidewall which exhibits a roughness thereon and which extends in parallel to an axis through the semiconductor body. The semiconductor body is bombarded with a molecular beam directed along or in parallel with the axis to reduce the roughness.

Another embodiment relates to a method in which a substrate is provided. The method repeatedly alternates between using a fluorine-based plasma to etch a trench, which has trench sidewalls, into a selected region of the substrate and using a fluorocarbon plasma to deposit a liner on the trench sidewalls. The trench has an exposed sidewall surface that includes scalloped recesses. To smooth the scalloped recesses, the method bombards the trench with a molecular beam where the molecules are directed in a direction parallel to the trench sidewalls.

Still another embodiment relates to an integrated circuit (IC). The IC includes a semiconductor body having a trench therein. The trench has a sidewall trench surface and a bottom trench surface. An inert gas doped region is proximate to the bottom trench surface and is disposed within the semiconductor body.

It will be appreciated that identifiers such as "first" and "second" do not imply any type of ordering, placement, or temporal relationship with respect to other elements; but rather "first" and "second" and other similar identifiers are just generic identifiers and these elements can be swapped in other implementations. Thus, while methods illustrated and described herein may be illustrated and/or described as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method, comprising:
    forming a trench having an axis extending into a semiconductor body, wherein the trench has a sidewall surface exhibiting scallops having respective troughs which are arranged at different depths in the trench and which meet at respective crests; and
    bombarding the semiconductor body with a molecular beam directed along or in parallel with the axis to reduce heights of the crests and thereby establish a plateau having a planar or substantially planar surface which extends between neighboring troughs corresponding to remnants of neighboring scallops.

2. The method of claim 1, wherein the molecular beam comprises an ionized noble gas.

3. The method of claim 1, wherein the molecular beam comprises ionized argon.

4. The method of claim 2, wherein the sidewall surface is made up of a series of scalloped recesses having a height defined between a scallop crest and a scallop trough.

5. The method of claim 4, wherein bombarding the semiconductor body with ionized noble gas reduces the height by at least half.

6. The method of claim 1, wherein forming the trench and bombarding the semiconductor body are both carried out in a process chamber of a plasma etching tool.

7. The method of claim 6, wherein fluorine is present in the process chamber while the semiconductor body is bombarded with the molecular beam.

8. A method, comprising:
    providing a substrate;
    repeatedly alternating between: using a fluorine-based plasma to etch a trench, which has trench sidewalls, into a selected region of the substrate and using a fluorocarbon plasma to deposit a liner on the trench sidewalls, wherein at least one of the trench sidewalls or the liner exhibit scallops having respective troughs which are arranged at different depths in the trench and which meet at respective crests; and
    bombarding the trench with a molecular beam, which is directed along an axis that is parallel to the trench sidewalls, to reduce heights of the crests and thereby establish a plateau having a planar or substantially planar surface which extends between remnants of neighboring troughs.

9. The method of claim 8, wherein the molecular beam is made up of inert gas molecules.

10. The method of claim 9, wherein the inert gas molecules comprise argon gas molecules.

11. The method of claim 9, wherein prior to bombarding the trench with the inert gas molecules, a trench sidewall comprises neighboring scalloped recesses which have a height of approximately 4000 angstroms as measured between a crest of a scallop and a trench sidewall surface.

12. The method of claim 11, wherein after bombarding the trench with the inert gas molecules, the scalloped recesses have a height of approximately 1000 angstroms or less as measured between a crest of a scallop and trench sidewall surface.

13. The method of claim 8, wherein the trench has a depth to width aspect ratio of between approximately 3:1 and approximately 15:1.

14. The method of claim 8, wherein $SF_6$ is a source gas used for the fluorine based plasma.

15. The method of claim 14, wherein octofluorocyclobutane ($c-C_4F_8$) is a source gas used for the fluorocarbon plasma.

16. An integrated circuit comprising:
    a semiconductor body having a trench therein, wherein the trench has a sidewall trench surface and a bottom trench surface, wherein the sidewall trench surface exhibits first and second scallops having first and second troughs, respectively, which are arranged at different depths and which meet a plateau having a planar surface which extends between nearest edges of the first and second troughs; and
    an inert gas doped region proximate to the bottom trench surface and disposed within the semiconductor body.

17. The integrated circuit of claim 16, wherein the inert gas doped region has a first dopant concentration, which is approximately constant over a central region of the bottom trench surface, and a second dopant concentration which is lower than the first dopant concentration near an edge of the bottom trench surface adjacent to the sidewall trench surface.

18. The integrated circuit of claim 17, wherein the sidewalls of the trench are substantially smooth.

19. The integrated circuit of claim 17, wherein an amplitude or height between a trough and the plateau is less than 500 angstroms.

20. The integrated circuit of claim 17, wherein the sidewalls near the bottom trench surface have an inert gas dopant concentration that is less than the first dopant concentration.

* * * * *